United States Patent
Yao et al.

(10) Patent No.: US 9,812,472 B2
(45) Date of Patent: Nov. 7, 2017

(54) PREPARATION METHOD OF OXIDE THIN-FILM TRANSISTOR

(71) Applicant: BOE Technology Group Co., Ltd., Beijing (CN)

(72) Inventors: Qi Yao, Beijing (CN); Feng Zhang, Beijing (CN); Zhanfeng Cao, Beijing (CN); Xiaolong He, Beijing (CN); Bin Zhang, Beijing (CN); Zhengliang Li, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 15/308,991

(22) PCT Filed: Jan. 25, 2016

(86) PCT No.: PCT/CN2016/072012
§ 371 (c)(1),
(2) Date: Nov. 4, 2016

(87) PCT Pub. No.: WO2017/008497
PCT Pub. Date: Jan. 19, 2017

(65) Prior Publication Data
US 2017/0162612 A1 Jun. 8, 2017

(30) Foreign Application Priority Data
Jul. 15, 2015 (CN) .......................... 2015 1 0415622

(51) Int. Cl.
*H01L 27/12* (2006.01)
*H01L 29/66* (2006.01)
(Continued)

(52) U.S. Cl.
CPC ........ *H01L 27/1288* (2013.01); *H01L 27/127* (2013.01); *H01L 27/1225* (2013.01);
(Continued)

(58) Field of Classification Search
CPC ............. H01L 27/1288; H01L 27/1225; H01L 27/127; H01L 29/45
See application file for complete search history.

(56) References Cited

U.S. PATENT DOCUMENTS

2006/0183263 A1 8/2006 Lin et al.
2011/0273639 A1* 11/2011 Xie .................. G02F 1/136286
349/43
2015/0372021 A1* 12/2015 Yuan ................. H01L 29/78678
257/72

FOREIGN PATENT DOCUMENTS

CN 101097381 A 1/2008
CN 102812555 A 12/2012
(Continued)

OTHER PUBLICATIONS

Apr. 28, 2016—(WO) International Search Report and Written Opinion Appn PCT/CN2016/072012 with English Tran.
(Continued)

Primary Examiner — Errol Fernandes
(74) Attorney, Agent, or Firm — Banner & Witcoff, Ltd.

(57) ABSTRACT

A preparation method of an oxide thin-film transistor is disclosed, and this method includes: forming a gate electrode, a gate insulating layer, an active layer, a source electrode and a drain electrode; forming of the active layer, the source electrode and the drain electrode includes: sequentially forming an oxide semiconductor thin film and a source-drain electrode metal thin film on a base substrate, an entire surface of the oxide semiconductor thin film being in direct contact with the source-drain electrode metal thin film; and patterning the oxide semiconductor thin film and the source-drain electrode metal thin film with a dual-tone mask so as to form the active layer, the source electrode and the drain electrode by a single patterning process.

18 Claims, 6 Drawing Sheets

(51) Int. Cl.
*H01L 29/786* (2006.01)
*H01L 29/45* (2006.01)

(52) U.S. Cl.
CPC ........ *H01L 29/45* (2013.01); *H01L 29/66969* (2013.01); *H01L 29/7869* (2013.01)

(56) References Cited

FOREIGN PATENT DOCUMENTS

| | | | |
|---|---|---|---|
| CN | 102832253 | A | 12/2012 |
| CN | 103715272 | A | 4/2014 |
| CN | 103717787 | A | 4/2014 |
| CN | 105140131 | A | 12/2015 |
| WO | 2004055917 | A2 | 7/2004 |

OTHER PUBLICATIONS

Jun. 14, 2017—(CN) First Office Action Appn 201510415622.5 with English Tran.

\* cited by examiner

PREPARATION METHOD OF OXIDE THIN-FILM TRANSISTOR

The application is a U.S. National Phase Entry of International Application No. PCT/CN2016/072012 filed on Jan. 25, 2016, designating the United States of America and claiming priority to Chinese Patent Application No. 201510415622.5 filed on Jul. 15, 2015. The present application claims priority to and the benefit of the above-identified applications and the above-identified applications are incorporated by reference herein in their entirety.

TECHNICAL FIELD

Embodiments of the present disclosure relate to a preparation method of an oxide thin-film transistor.

BACKGROUND

In recent years, along with rapid development of display technologies, thin-film transistors for driving and controlling pixels are also in development, and have been developed as oxide thin-film transistors from amorphous-silicon thin-film transistors and low temperature poly-silicon thin-film transistors.

Oxide thin-film transistors have excellent characteristics of electronic mobility, ON-state current, switching characteristic or the like. Moreover, oxide thin-film transistors also have the advantages such as less characteristic unevenness, low material and process cost, low processing temperature, capacity of utilizing a coating process, high light transmittance, large band gap, or the like. Therefore, oxide thin-film transistors can be used for display devices which need a rapid response and a large driving current, e.g., liquid crystal displays, organic light emitting displays or the like with high frequencies, high resolutions and large sizes.

Generally, the oxide thin-film transistor with an etch stop layer needs to be prepared with four masks by four patterning processes. Namely, a gate electrode is formed with a first mask by a first patterning process; a gate insulating layer is formed; an active layer is formed with a second mask by a second patterning process; the etch stop layer is formed with a third mask by a third patterning process; and a source electrode and a drain electrode are formed with a fourth mask by a fourth patterning process. The etch stop layer needs to be prepared, so production cost is increased and possibility of reducing yield is increased.

Currently, there has been proposed a back channel etching process which does not adopt the etch stop layer. FIG. 1(a) to FIG. 1(c) are flow charts of preparing an oxide thin-film transistor by adopting the back channel etching process according to one technology. As shown in FIG. 1(a) to FIG. 1(c), preparation of the oxide thin-film transistor by adopting the back channel etching process needs to be completed with three masks by three patterning processes. Namely, a gate electrode 02 (as shown in FIG. 1(a)) is formed with a first mask by a first patterning process; a gate insulating layer 03 (as shown in FIG. 1(b)) is formed; an active layer 04 (as shown in FIG. 1(b)) is formed with a second mask by a second patterning process; and a source electrode 05 and a drain electrode 06 (as shown in FIG. 1(c)) are formed with a third mask by a third patterning process.

If the number of the masks can be further reduced, a preparation process of the oxide thin-film transistor can be simplified, and preparation cost can be reduced.

SUMMARY

According to an embodiment of the present disclosure, there is provided a preparation method of an oxide thin-film transistor, comprising: forming a gate electrode, a gate insulating layer, an active layer, a source electrode and a drain electrode. Forming of the active layer, the source electrode and the drain electrode includes: sequentially forming an oxide semiconductor thin film and a source-drain electrode metal thin film on a base substrate, an entire surface of the oxide semiconductor thin film being in direct contact with the source-drain electrode metal thin film; and patterning the oxide semiconductor thin film and the source-drain electrode metal thin film with a dual-tone mask so as to form the active layer, the source electrode and the drain electrode by a single patterning process.

For example, patterning of the oxide semiconductor thin film and the source-drain electrode metal thin film with a dual-tone mask so as to form the active layer, the source electrode and the drain electrode by the single patterning process includes: forming a photoresist layer on the source-drain electrode metal thin film; carrying out exposure and development on the photoresist layer to form a photoresist fully-reserved portion, a photoresist partially-reserved portion and a photoresist fully-removed portion, wherein the photoresist fully-reserved portion corresponds to a region where the source electrode and the drain electrode are to be formed, the photoresist partially-reserved portion corresponds to a region, between the source electrode and the drain electrode, where a channel is to be formed, a thickness of photoresist in the photoresist partially-reserved portion is smaller than a thickness of photoresist in the photoresist fully-reserved portion, and the photoresist fully-removed portion corresponds to remaining regions; carrying out a first etching process to remove the source-drain electrode metal thin film and the oxide semiconductor thin film in the photoresist fully-removed portion so as to form the active layer; carrying out an ashing process to remove the photoresist in the photoresist partially-reserved portion; carrying out a second etching process to remove the source-drain electrode metal thin film in the photoresist partially-reserved portion so as to form the source electrode and the drain electrode; and removing the photoresist in the photoresist fully-reserved portion.

For example, the source-drain electrode metal thin film is made of Cu or Cu alloy, and the second etching process adopts a fluoride-free etching solution.

For example, the Cu alloy is CuMo alloy, CuMn alloy, CuTa alloy, CuCa alloy, CuMg alloy or CuMgAl alloy.

For example, the fluoride-free etching solution is a fluoride-free H2O2 etching solution.

For example, the preparation method may further comprise: forming a first antioxidant cover layer covering the source electrode and a second antioxidant cover layer covering the drain electrode. Forming of the active layer, the source electrode, the drain electrode, the first antioxidant cover layer and the second antioxidant cover layer includes: sequentially forming the oxide semiconductor thin film, the source-drain electrode metal thin film and an antioxidant thin film on the base substrate; and patterning the oxide semiconductor thin film, the source-drain electrode metal thin film and the antioxidant thin film with a dual-tone mask so as to form the active layer, the source electrode, the drain electrode, the first antioxidant cover layer and the second antioxidant cover layer by a single patterning process.

For example, patterning of the oxide semiconductor thin film, the source-drain electrode metal thin film and the antioxidant thin film with the dual-tone mask so as to form the active layer, the source electrode, the drain electrode, the first antioxidant cover layer and the second antioxidant cover layer by the single patterning process includes: forming a photoresist layer on the antioxidant thin film, and carrying out exposure and development on the photoresist layer to form a photoresist fully-reserved portion, a photoresist partially-reserved portion and a photoresist fully-removed portion, wherein the photoresist fully-reserved portion corresponds to a region where the source electrode and the drain electrode are to be formed, the photoresist partially-reserved portion corresponds to a region, between the source electrode and the drain electrode, where a channel is to be formed, a thickness of photoresist in the photoresist partially-reserved portion is less than a thickness of photoresist in the photoresist fully-reserved portion, and the photoresist fully-removed portion corresponds to remaining regions; carrying out a first etching process to remove the antioxidant thin film, the source-drain electrode metal thin film and the oxide semiconductor thin film in the photoresist fully-removed portion so as to form the active layer; carrying out an ashing process to remove the photoresist in the photoresist partially-reserved portion; carrying out a second etching process to remove the antioxidant thin film in the photoresist partially-reserved portion so as to form the first antioxidant cover layer and the second antioxidant cover layer; carrying out a third etching process to remove the source-drain electrode metal thin film in the photoresist partially-reserved portion so as to form the source electrode and the drain electrode; and removing the photoresist in the photoresist fully-reserved portion.

For example, the source-drain electrode metal thin film is made of Cu or Cu alloy, and the third etching process adopts a fluoride-free etching solution.

For example, the Cu alloy is CuMo alloy, CuMn alloy, CuTa alloy, CuCa alloy, CuMg alloy or CuMgAl alloy.

For example, the fluoride-free etching solution is a fluoride-free H2O2 etching solution.

For example, the first etching process and the second etching process are wet etching processes, and an etching rate of the second etching process is smaller than that of the first etching process.

For example, the first antioxidant cover layer and the second antioxidant cover layer are made of Mo or MoNb.

For example, the first antioxidant cover layer and the second antioxidant cover layer are made of an oxide semiconductor material.

For example, the preparation method may further comprise: carrying out plasma processing on the first antioxidant cover layer and/or the second antioxidant cover layer.

For example, the preparation method may further comprise: forming a protective layer to cover the first antioxidant cover layer, the second antioxidant cover layer, the source electrode, the drain electrode, the active layer, the gate insulating layer and the base substrate; and forming a first via hole in the protective layer so as to carry out plasma processing on the first antioxidant cover layer through the first via hole, and/or forming a second via hole in the protective layer so as to carry out plasma processing on the second antioxidant cover layer through the second via hole.

For example, operations of forming the first via hole in the protective layer, forming the second via hole in the protective layer and carrying out plasma processing on the first antioxidant cover layer and/or the second antioxidant cover layer are carried out in a same dry-etching device.

For example, a gas for carrying out the plasma processing is selected from one or more of He, SF6 or H2.

For example, the first antioxidant cover layer, the second antioxidant cover layer and the active layer are made of a same material.

For example, a pattern of the first antioxidant cover layer is same as a pattern of the source electrode, and a pattern of the second antioxidant cover layer is same as a pattern of the drain electrode.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

Figure 1A:
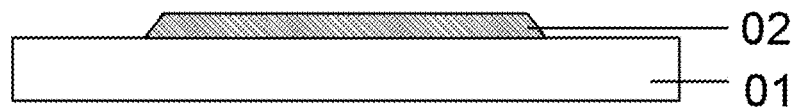
FIG. 1(a) to FIG. 1(c) are flow charts of preparing an oxide thin-film transistor by adopting a back channel etching process according to one technology.
Figure 1B:
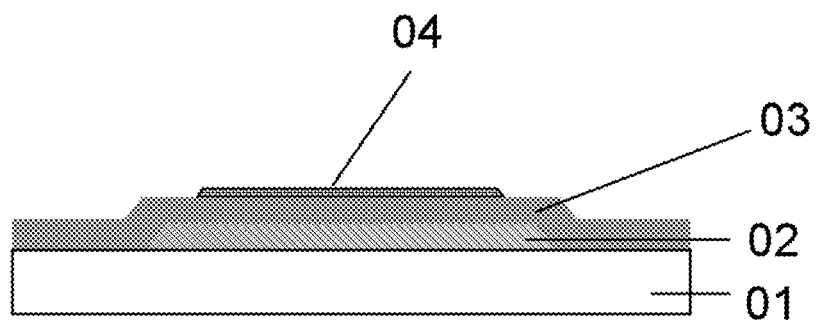
Figure 1C:
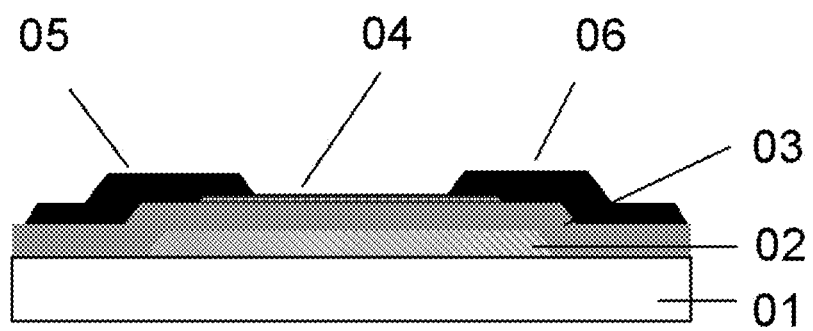

In order to make objects, technical details and advantages of the embodiments of the disclosure apparent, the technical solutions of the embodiments will be described in a clearly and fully understandable way in connection with the drawings related to the embodiments of the disclosure. It is obvious that the described embodiments are just a part but not all of the embodiments of the disclosure. Based on the described embodiments of the disclosure herein, those skilled in the art can obtain all other embodiment(s), without any inventive work, which should be within the scope of the disclosure.

Unless otherwise defined, the technical terms or scientific terms here should be of general meaning as understood by those ordinarily skilled in the art. In the patent application description and claims of the present disclosure, words such as "first", "second" or the like do not denote any order, quantity, or importance, but rather are used for distinguishing different components. Similarly, words such as "one", "a/an" or "the" or the like do not denote quantitative limitation, but rather indicate there is at least one. Words such as "include" or "comprise" or the like denote that elements or objects appearing before the words of "include" or "comprise" cover the elements or the objects enumerated after the words of "include" or "comprise" or equivalents thereof, not exclusive of other elements or objects. Words such as "up", "down", "left", "right" or the like are only used for expressing relative positional relationship, when the absolute position is a described object is changed, the relative positional relationship may also be correspondingly changed.

An embodiment of the present disclosure provides a preparation method of an oxide thin-film transistor. The method includes: forming a gate electrode, a gate insulating layer, an active layer, a source electrode and a drain electrode; forming of the active layer, the source electrode and the drain electrode includes: sequentially forming an oxide semiconductor thin film and a source-drain electrode metal thin film on a base substrate, an entire surface of the oxide semiconductor thin film being in direct contact with the source-drain electrode metal thin film; and patterning the oxide semiconductor thin film and the source-drain electrode metal thin film with a dual-tone mask so as to form the active layer, the source electrode and the drain electrode by a single patterning process.

In the preparation method of the oxide thin-film transistor according to the embodiment of the present disclosure, the entire surface of the oxide semiconductor thin film is in direct contact with the source-drain electrode metal thin film, so a back channel etching process can be adopted to avoid the preparation of an etch stop layer. Further, in the preparation method of the oxide thin-film transistor according to the embodiment of the present disclosure, due to adoption of the dual-tone mask, the active layer, the source electrode and the drain electrode can be simultaneously formed by a single patterning process, so that preparation of the thin-film transistor can be completed only with two masks. Therefore, the preparation method of the oxide thin-film transistor according to the embodiment of the present disclosure organically combines the back channel etching process with a dual-tone mask process together, and can further reduce the number of the masks while avoiding production of the etch stop layer, so as to simplify a production process, reduce production cost and improve product yield.

Hereinafter, the preparation method of the oxide thin-film transistor according to the embodiment of the present disclosure will be described in detail in connection with the drawings. It should be noted that the preparation method of the oxide thin-film transistor according to the embodiment of the present disclosure can be used for preparing an oxide thin-film transistor of a bottom gate type, an oxide thin-film transistor of a top gate type or oxide thin-film transistors of other types, and will be described in the following only by taking the oxide thin-film transistor of a bottom gate type as an example.

FIG. 2(a) to FIG. 2(g) show the preparation method of the oxide thin-film transistor according to the embodiment of the present disclosure. For example, as shown in FIG. 2(a) to FIG. 2(g), the preparation method of the oxide thin-film transistor according to the embodiment of the present disclosure includes the following operations:

S1: forming a gate electrode.

Figure 2A:
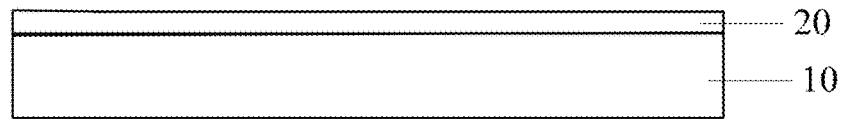
FIG. 2(a) to FIG. 2(g) show a preparation method of an oxide thin-film transistor according to an embodiment of the present disclosure.
Figure 2B:
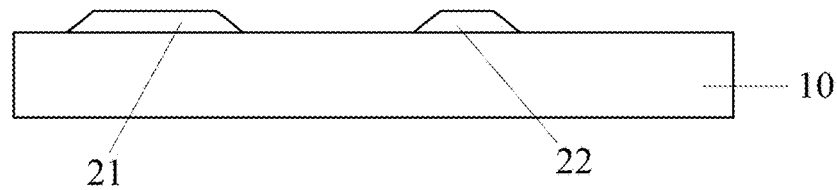

As shown in FIG. 2(a) and FIG. 2(b), a gate metal thin film 20 is formed on a base substrate 10, and the gate metal thin film 20 is patterned with a single-tone mask so as to form the gate electrode 21.

For example, the base substrate 10 can be a glass substrate, a quartz substrate, an organic substrate or the like. For example, the gate metal thin film 20 can be made of a metal such as Cr, W, Cu, Ti, Ta, Mo, Al or the like, or an alloy such as Al—Nd alloy or the like. Further, in order to obtain the gate electrode 21 with excellent conducting property, the gate metal film 20 is, for example, made of Cu or Cu alloy with low electrical resistivity. For example, Cu alloy may be CuMo alloy, CuMn alloy, CuTa alloy, CuCa alloy, CuMg alloy, CuMgAl alloy or the like.

The process of forming the gate electrode 21 with the single-tone mask to pattern the gate metal thin film 20 may adopt a conventional patterning process, which is not repeated herein.

S2: forming a gate insulating layer.

Figure 2C:
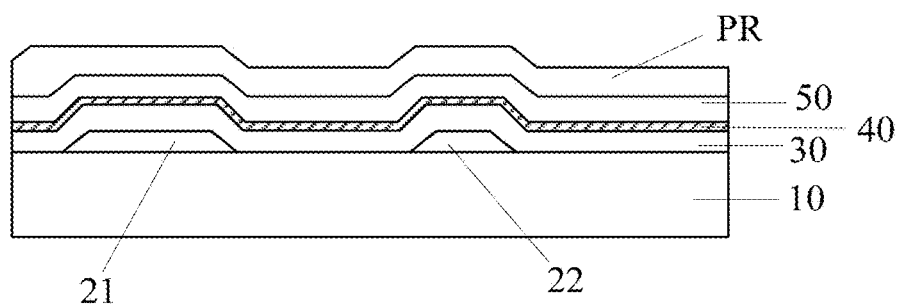

As shown in FIG. 2(c), the gate insulating layer 30 is formed to cover the gate electrode 21 and the base substrate 10. For example, the gate insulating layer 30 is made of silicon nitride, silicon oxide, silicon oxynitride, aluminium oxide or the like by adopting methods of plasma-enhanced chemical vapor deposition, sputtering or the like.

S3: forming an active layer, a source electrode and a drain electrode.

For example, as shown in FIG. 2(c) to FIG. 2(g), an oxide semiconductor thin film 40 and a source-drain electrode metal thin film 50 are sequentially formed on the gate insulating layer 30, and an entire surface of the oxide semiconductor thin film 40 is in direct contact with the source-drain electrode metal thin film 50; and the oxide semiconductor thin film 40 and the source-drain electrode metal thin film 50 are patterned with a dual-tone mask so as to form an active layer 41, a source electrode 51 and a drain electrode 52 by a single patterning process.

For example, the oxide semiconductor thin film 40 can be a thin film made of an oxygen element with at least two of elements of In (indium), Ga (gallium), Zn (zinc), Sn (tin) or the like. For example, the oxide semiconductor thin film 40 can be an IGZO (indium gallium zinc oxide) thin film, an IZO (indium zinc oxide) thin film, an InSnO (indium tin oxide) thin film, an InGaSnO (indium gallium tin oxide) thin film or the like. For example, a thickness of the oxide semiconductor thin film 40 is from 100 Å to 1,000 Å, and preferably from 150 Å to 300 Å.

For example, the source-drain electrode metal thin film 50 can be made of a metal such as Cr, W, Cu, Ti, Ta, Mo, Al or the like or an ally such as an Al—Nd alloy or the like. Further, in order to obtain the source electrode 51 and the drain electrode 52 which have excellent conducting properties, the source-drain electrode metal thin film 50 is, for example, made of Cu or Cu alloy with low electrical resistivity. For example, Cu alloy may be CuMo alloy, CuMn alloy, CuTa alloy, CuCa alloy, CuMg alloy, CuMgAl alloy or the like.

For example, the dual-tone mask is a half-tone mask or a gray-tone mask.

Figure 2D:
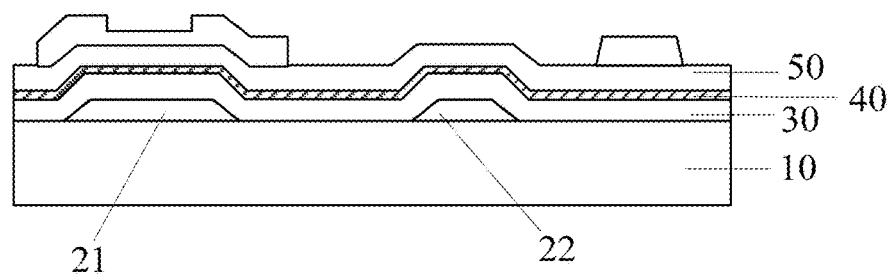
Figure 2E:
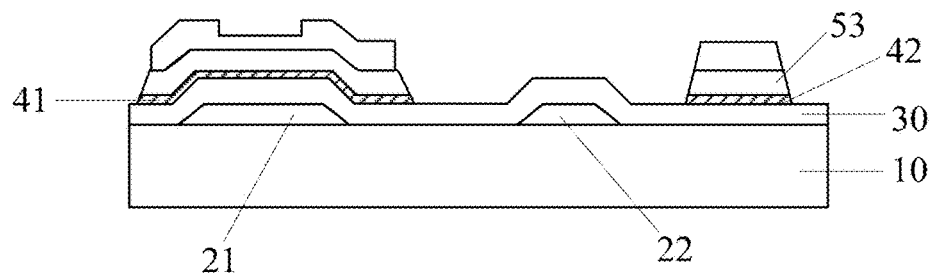
Figure 2F:
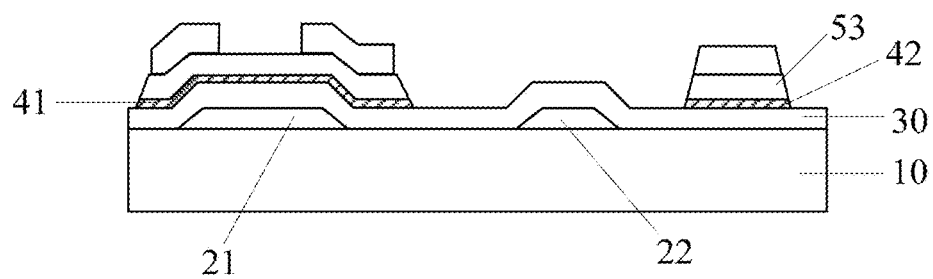
Figure 2G:
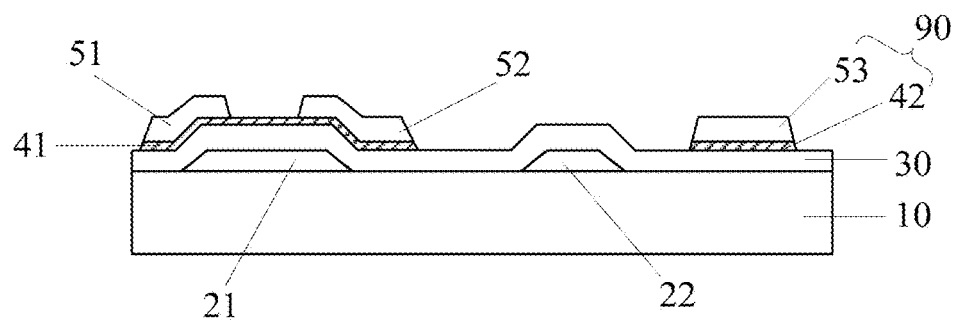

For example, patterning of the oxide semiconductor thin film 40 and the source-drain electrode metal thin film 50 with the dual-tone mask so as to form the active layer 41, the source electrode 51 and the drain electrode 52 by the single patterning process includes the following operations:

Forming a photoresist layer PR on the source-drain electrode metal thin film, as shown in FIG. 2(c);

Carrying out exposure and development on the photoresist layer PR to form a photoresist fully-reserved portion, a photoresist partially-reserved portion and a photoresist fully-removed portion, wherein the photoresist fully-reserved portion corresponds to a region where the source electrode 51 and the drain electrode 52 are to be formed, the photoresist partially-reserved portion corresponds to a region, between the source electrode 51 and the drain electrode 52, where a channel is to be formed, a thickness of photoresist in the photoresist partially-reserved portion is smaller than that of photoresist in the photoresist fully-reserved portion, and the photoresist fully-removed portion corresponds to remaining regions, as shown in FIG. 2(d);

Carrying out a first etching process to remove the source-drain electrode metal thin film 50 and the oxide semiconductor thin film 40 in the photoresist fully-removed portion so as to form the active layer 41, as shown in FIG. 2(e);

Carrying out an ashing process to remove the photoresist in the photoresist partially-reserved portion, as shown in FIG. 2(f);

Carrying out a second etching process to remove the source-drain electrode metal thin film 50 in the photoresist partially-reserved portion so as to form the source electrode 51 and the drain electrode 52, as shown in FIG. 2(g); and Removing the photoresist in the photoresist fully-reserved portion, as shown in FIG. 2(g).

As described above, in order to obtain the source electrode 51 and the drain electrode 52 which have excellent conducting properties, the source-drain electrode metal thin film 50 is, for example, made of Cu or Cu alloy with low electrical resistivity. For a display device, such as a liquid crystal display device, an organic light-emitting display device or the like, through patterning the source-drain electrode metal thin film 50, a data line which is directly connected or integrated with the source electrode 51 can be simultaneously formed on the same layer as and the source electrode 51 as well as the drain electrode 52; in this way, if the source-drain electrode metal thin film 50 is made of Cu or Cu alloy with low electrical resistivity, the data line, the source electrode 51 and the drain electrode 52 which have excellent conducting properties can be simultaneously obtained, which is very beneficial to the large-sized display device.

Further, in a case that the source-drain electrode metal thin film 50 is made of Cu or Cu alloy, the second etching process, for example, adopts a fluoride-free etching solution to etch and remove the source-drain electrode metal thin film 50 in the photoresist partially-reserved portion so as to form the source electrode 51 and the drain electrode 52. The inventors have found that by adopting the fluoride-free etching solution, not only can the source-drain electrode metal thin film 50 in the photoresist partially-reserved portion be sufficiently etched and removed, but also damage to the active layer 41 can be effectively reduced and even avoided. For example, the fluoride-free etching solution is a fluoride-free $H_2O_2$ etching solution; the fluoride-free $H_2O_2$ etching solution is an etching solution using fluoride-free $H_2O_2$ as the main component, and for example, in the etching solution, a mass ratio of the fluoride-free $H_2O_2$ is about 5% to 30%. Further, for example, the fluoride-free $H_2O_2$ etching solution is a neutral fluoride-free $H_2O_2$ etching solution.

For example, the first etching process is a wet etching process and for example, adopts an acid etching solution.

Through the above steps S1, S2 and S3, the preparation method of the oxide thin-film transistor according to the embodiment of the present disclosure can be completed. The preparation method of the oxide thin-film transistor according to the embodiment of the present disclosure does not need to prepare the etch stop layer, effectively combines the back channel etching process with the dual-tone mask process together, and can further reduce the number of the masks while avoiding production of the etch stop layer, so as to simplify the production process, reduce production cost and improve product yield. Further, in the preparation method of the oxide thin-film transistor according to the embodiment of the present disclosure, Cu or Cu alloy is adopted to form the source-drain electrode metal thin film, so that the source electrode and the drain electrode which have excellent conducting properties can be obtained, which is beneficial to application of the oxide thin-film transistor to the large-sized display device. Further, the preparation method of the oxide thin-film transistor according to the embodiment of the present disclosure adopts the fluoride-free etching solution to etch and remove the source-drain electrode metal thin film in the photoresist partially-reserved portion, so that not only can the source-drain electrode metal thin film in the photoresist partially-reserved portion be sufficiently etched and removed, but also damage to the active layer can be effectively reduced and even avoided, and characteristics of the oxide thin-film transistor are improved.

In order to further improve the characteristics of the oxide thin-film transistor, commonly, the oxide thin-film transistor needs to be annealed repeatedly, or a $SiO_2$ protective layer, for example, needs to be formed on the oxide thin-film transistor. In the process of repeatedly carrying out annealing or forming, for example, the $SiO_2$ protective layer, the source electrode 51 and the drain electrode 52 may be oxidized more or less, and in the case that the source electrode 51 and the drain electrode 52 are formed by Cu or Cu alloy with low electrical resistivity, oxidization is relatively obvious. In order to avoid the problem, the preparation method of the oxide thin-film transistor according to the embodiment of the present disclosure may further include: forming a first antioxidant cover layer 61 covering the source electrode 51 and a second antioxidant cover layer 62 covering the drain electrode 52. Through forming the first antioxidant cover layer 61 and the second antioxidant cover layer 62, the source electrode 51 and the drain electrode 52 can be effectively prevented from being oxidized.

FIG. 3(a) to FIG. 3(g) show a variation of the preparation method of the oxide thin-film transistor according to the embodiment of the present disclosure, wherein a first antioxidant cover layer 61 and a second antioxidant cover layer 62 are formed. For example, the variation of the preparation method of the oxide thin-film transistor according to the embodiment of the present disclosure includes the following operations:

S11: forming a gate;

For example, this step is the same as step S1, can refer to FIG. 2(a) and FIG. 2(b), and is not repeated here.

S22: forming a gate insulating layer;

For example, the step is the same as step S2, can refer to FIG. 2(c), and is not repeated here.

S33: forming an active layer, a source electrode, a drain electrode, a first antioxidant cover layer and a second antioxidant cover layer.

For example, as shown in FIG. 3(a) to FIG. 3(f), an oxide semiconductor thin film 40, a source-drain electrode metal thin film 50 and an antioxidant thin film 60 are sequentially formed on the gate insulating layer 30; and the oxide semiconductor thin film 40, the source-drain electrode metal thin film 50 and the antioxidant thin film 60 are patterned with a dual-tone mask so as to form the active layer 41, the source electrode 51, the drain electrode 52, the first antioxidant cover layer 61 and the second antioxidant cover layer 62 by a single patterning process.

For example, the dual-tone mask is a half-tone mask or a gray tone mask.

Figure 3A:
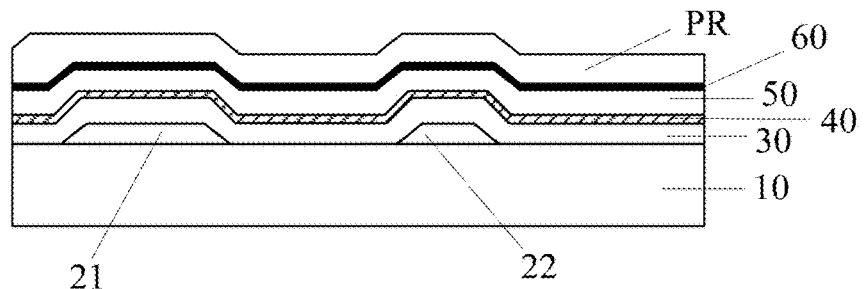
FIG. 3(a) to FIG. 3(g) show a variation of the preparation method of the oxide thin-film transistor according to an embodiment of the present disclosure.
Figure 3B:
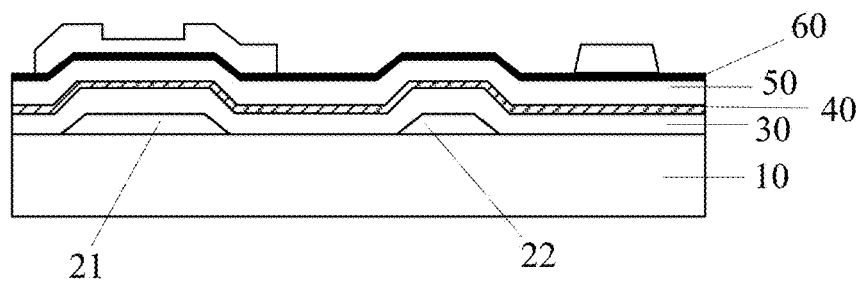
Figure 3C:
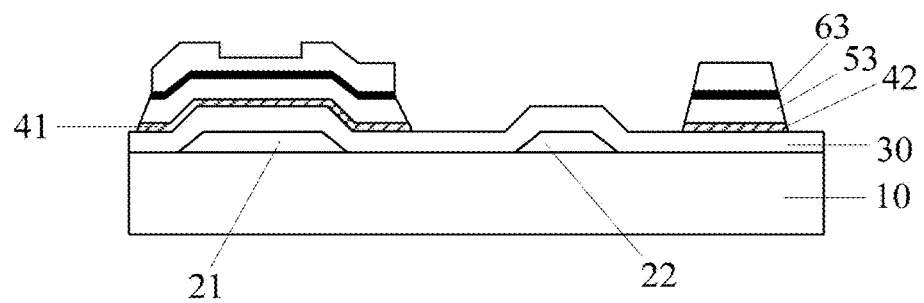
Figure 3D:
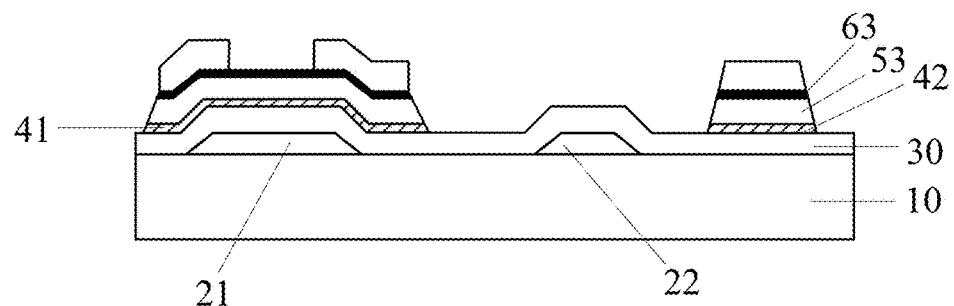
Figure 3E:
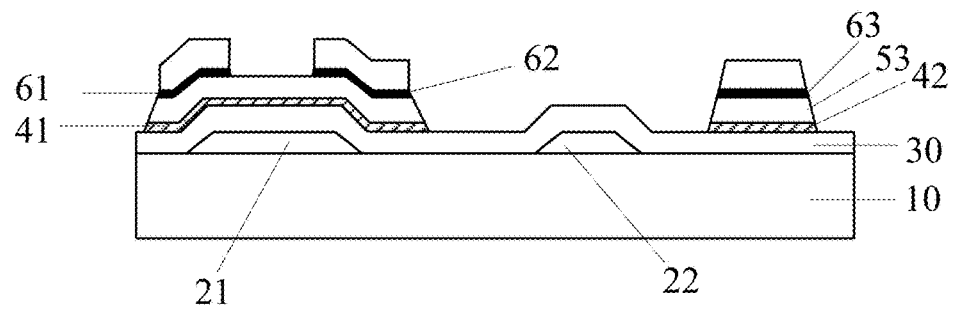
Figure 3F:
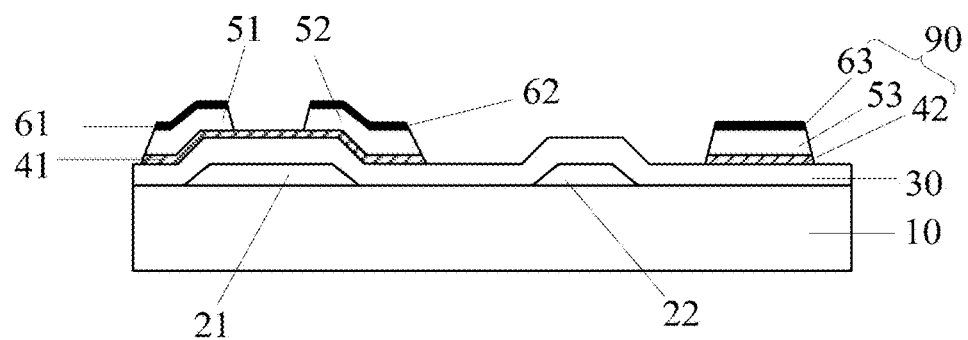

For example, patterning of the oxide semiconductor thin film 40, the source-drain electrode metal thin film 50 and the antioxidant thin film 60 with the dual-tone mask so as to form the active layer 41, the source electrode 51, the drain electrode 52, the first antioxidant cover layer 61 and the second antioxidant cover layer 62 by the single patterning process includes the following operations:

Forming a photoresist layer PR on the antioxidant thin film 60, as shown in FIG. 3(a);

Carrying out exposure and development on the photoresist layer PR to form a photoresist fully-reserved portion, a photoresist partially-reserved portion and a photoresist fully-removed portion, wherein the photoresist fully-reserved portion corresponds to a region where the source electrode and the drain electrode are to be formed, the photoresist partially-reserved portion corresponds to a region, between the source electrode and the drain electrode, where a channel is to be formed, a thickness of photoresist in the photoresist partially-reserved portion is smaller than that of photoresist in the photoresist fully-reserved portion, and the photoresist fully-removed portion corresponds to remaining regions, as shown in FIG. 3(b);

Carrying out a first etching process to remove the antioxidant thin film 60, the source-drain electrode metal thin film 50 and the oxide semiconductor thin film 40 in the photoresist fully-removed portion so as to form the active layer 41, as shown in FIG. 3(c);

Carrying out an ashing process to remove the photoresist in the photoresist partially-reserved portion, as shown in FIG. 3(d);

Carrying out a second etching process to remove the antioxidant thin film 60 in the photoresist partially-reserved portion so as to form the first antioxidant cover layer 61 and the second antioxidant cover layer 62, as shown in FIG. 3(e);

Carrying out a third etching process to remove the source-drain electrode metal thin film 50 in the photoresist partially-reserved portion so as to form the drain electrode 51 and the drain electrode 52, as shown in FIG. 3(f); and Removing the photoresist in the photoresist fully-reserved portion, as shown in FIG. 3(f).

For example, as described above, the source-drain electrode metal thin film 50 can be made of Cu or Cu alloy with low electrical resistivity, so that the source electrode and the drain electrode which have excellent conducting properties can be obtained, which is beneficial to application of the oxide thin-film transistor to a large-sized display device. Further, in the case that the source-drain electrode metal thin film 50 is made of Cu or Cu alloy, the third etching process, for example, adopts a fluoride-free etching solution to etch and remove the source-drain electrode metal thin film 50 in the photoresist partially-reserved portion so as to form the source electrode 51 and the drain electrode 52. As described above, the inventors have found that by adopting the fluoride-free etching solution, not only can the source-drain electrode metal thin film 50 in the photoresist partially-reserved portion be sufficiently etched and removed, but also damage to the active layer 41 can be effectively reduced and even avoided. For example, the fluoride-free etching solution is a fluoride-free $H_2O_2$ etching solution; the fluoride-free $H_2O_2$ etching solution is an etching solution using fluoride-free $H_2O_2$ as a main component, and for example, in the etching solution, a mass ratio of the fluoride-free $H_2O_2$ is about 5% to 30%. Further, for example, the fluoride-free $H_2O_2$ etching solution is a neutral fluoride-free $H_2O_2$ etching solution.

For example, both the first etching process and the second etching process in step S33 are wet etching processes, and for example, each adopts an acid etching solution. For example, the etching rate of the second etching process is smaller than that of the first etching process. In this way, not only can the antioxidant thin film 60, the source-drain electrode metal thin film 50 and the oxide semiconductor thin film 40 in the photoresist fully-removed portion be rapidly and effectively removed in the first etching process, but also the antioxidant thin film 60 in the photoresist partially-reserved portion can be effectively removed in the second etching process while the etching solution is prevented from etching away the source-drain electrode metal thin film 50 positioned in the photoresist partially-reserved portion to damage the active layer 41, so that both efficiency and quality are considered. In addition, the first etching process and the second etching process are regulated only in terms of the etching rate, so the process difficulty can be reduced, and process efficiency can be improved.

In step S33, both the second etching process and the third etching process use the photoresist in the photoresist fully-reserved portion as an etching mask, so a pattern of the first antioxidant cover layer 61 and a pattern of the second antioxidant cover layer 62, which are formed in the second etching process, are respectively the same as the pattern of the source electrode 51 and the pattern of the drain electrode 52, which are formed in the third etching process.

For example, thicknesses of the first antioxidant cover layer 61 and the second antioxidant cover layer 62 are from 100 Å to 1,000 Å, and preferably from 500 Å to 800 Å.

For example, the first antioxidant cover layer 61 and the second antioxidant cover layer 62 are made of Mo, MoNb or the like.

For example, the first antioxidant cover layer 61 and the second antioxidant cover layer 62 are made of an oxide semiconductor material; and in such case, the antioxidant thin film 60 is an oxide semiconductor thin film. For example, if the antioxidant thin film 60 is the oxide semiconductor thin film, it can bring advantageous effects in the following: (1) the binding force between the oxide semiconductor thin film and the photoresist is good, and in the first, second and third etching processes, the photoresist drop-off phenomenon will not occur; and (2) the galvanic cell between the oxide semiconductor thin film and the source-drain electrode metal thin film 50 (for example, which is formed by Cu or Cu alloy) is small, which is easy to form a good etching slope angle and is beneficial for carrying out subsequent processes. For example, the oxide semiconductor material for forming the first antioxidant cover layer 61 and the second antioxidant cover layer 62 can be made of an oxygen element and at least two of elements of In (indium), Ga (gallium), Zn (zinc), Sn (tin) or the like. For example, the oxide semiconductor material can be IGZO, IZO, InSnO, InGaSnO or the like.

It should be noted that in the case that the first antioxidant cover layer 61 and the second antioxidant cover layer 62 are made of an oxide semiconductor material, the antioxidant thin film 60 is the oxide semiconductor thin film, and the inventors of the present disclosure have found that the volume of oxygen introduced in the process of preparing the oxide semiconductor thin film is very small and almost has no influence on the source-drain electrode metal thin film 50.

For example, in the case that the first antioxidant cover layer 61 and the second antioxidant cover layer 62 are made of an oxide semiconductor material, the variation of the preparation method of the oxide thin-film transistor according to the embodiment of the present disclosure further includes: carrying out plasma processing/treatment on the first antioxidant cover layer 61 and the second antioxidant cover layer 62. In this way, the first antioxidant cover layer 61 and/or the second antioxidant cover layer 62 can be converted into conductor from semiconductor, which is beneficial to electrical connection between the source electrode 51 and/or the drain electrode 52 and an external line.

It should be noted that, it can be determined, according to specific application, whether to carry out plasma processing on the first antioxidant cover layer 61 only, or carry out plasma processing on the second antioxidant cover layer 62 only, or carry out plasma processing on both the first antioxidant cover layer 61 and the second antioxidant cover layer 62. For example, for a display device, such as a liquid crystal display device, an organic light-emitting display device or the like, generally the source electrode 51 is directly connected or integrated with a data line, so plasma processing can be not carried out on the first antioxidant cover layer 61 covering the source electrode 51.

Figure 3G:
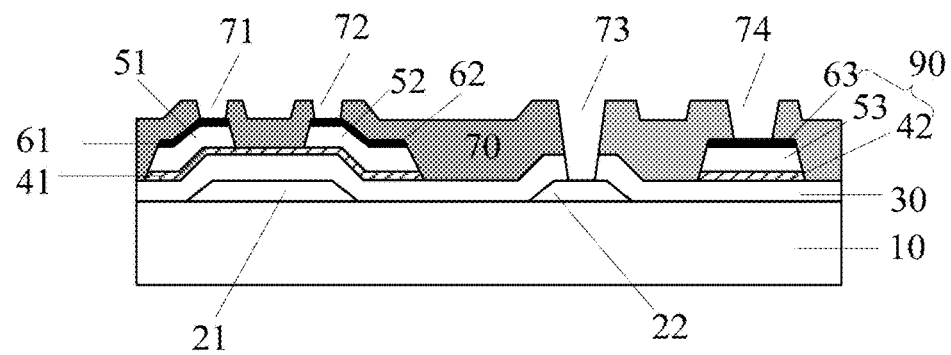

For example, as shown in FIG. 3(g), the variation of the preparation method of the thin-film transistor according to the embodiment of the present disclosure may further include: forming a protective layer 70 to cover the first antioxidant cover layer 61, the second antioxidant cover layer 62, the source electrode 51, the drain electrode 52, the active layer 41, the gate insulating layer 30 and the base substrate 10; and forming a first via hole 71 in the protective layer 70 so as to carry out plasma processing on the first antioxidant cover layer 61 through the first via hole 71, and/or forming a second via hole 72 in the protective layer 70 so as to carry out plasma processing on the second antioxidant cover layer 62 through the second via hole 72. For example, the protective layer 70 can protect the thin-film transistor from being influenced by the external environment, and the protective layer 70 is made of silicon oxide, silicon nitride or silicon oxynitride. For example, the operations of forming the first via hole 71 in the protective layer 70, forming the second via hole 72 in the protective layer 70 and carrying out plasma processing on the first antioxidant cover layer 61 and/or the second antioxidant cover layer 62 are carried out in a same dry etching device. Therefore, the process difficulty can be simplified, and process efficiency can be improved.

For example, the gas(es) for carrying out the plasma processing on the first antioxidant cover layer 61 and/or the second antioxidant cover layer 62 can be selected from one or more of He, $SF_6$ or $H_2$.

Based on the description above, the first antioxidant cover layer 61 and the second antioxidant cover layer 62 can be made of an oxide semiconductor material, and the active layer 41 is obtained by patterning the oxide semiconductor thin film 40. Thus it can be seen that the first antioxidant cover layer 61, the second antioxidant cover layer 62 and the active layer 41 can be made of a same material, e.g., IGZO. Therefore, device investments and types of raw materials can be reduced, and process costs can be reduced. In consideration of respective functions of the first antioxidant cover layer 61 and the second antioxidant cover layer 62, for example, the thickness of the active layer 41 is smaller than those of the antioxidant cover layers 61 and 62. For example, in an example, the source-drain electrode metal thin film 50 made of Cu or Cu alloy is clamped between the antioxidant thin film 60 made of IGZO and the oxide semiconductor thin film 40 made of IGZO, so that by the patterning process in step S33, the first antioxidant cover layer 61 and the second antioxidant cover layer 62 which are made of IGZO, the source electrode 51 and the drain electrode 52 which are made of Cu or Cu alloy, and the active layer 41 made of IGZO can be obtained.

The variation of the preparation method of the oxide thin-film transistor according to the embodiment of the present disclosure can obtain the same technical effects as the preparation method of the oxide thin-film transistor according to the embodiment of the present disclosure. Besides, in the variation of the preparation method of the oxide thin-film transistor according to the embodiment of the present disclosure, the first antioxidant cover layer covering the source electrode and the second antioxidant cover layer covering the drain electrode are formed, so that the source electrode and the drain electrode can be prevented from being oxidized.

It should be noted that the preparation method of the oxide thin-film transistor according to the embodiment of the present disclosure can be well compatible with a preparation method of an array substrate of the display device. For example, the display device can be any one of products or components with display function, e.g., a liquid crystal panel, an organic light-emitting display panel, a mobile phone, a tablet computer, a television, a display, a notebook computer, a digital photoframe, a navigator or the like.

Based on the preparation method of the oxide thin-film transistor according to the embodiment of the present disclosure, an embodiment of the present disclosure further provides a preparation method of an array substrate. The array substrate includes a display region and a peripheral region around the display region; in the display region, a plurality of gate lines and a plurality of data lines intersect with each other to form a plurality of sub-pixels arranged in matrix; and in each sub-pixel, a pixel electrode and a thin-film transistor connected with the pixel electrode are formed.

For example, the preparation method of the array substrate according to the embodiment of the present disclosure includes the following steps:

S111: forming a gate electrode, a gate line and a gate line contact pad.

For example, as shown in FIG. 2(a) and FIG. 2(b), the gate metal thin film 20 is patterned with the single-tone mask so as to simultaneously form the gate electrode 21, the gate line (not shown) and the gate line contact pad 22. Difference between step S111 and the steps S1 and S11 is that a pattern of the single-tone mask is changed.

For example, the gate line are connected with the gate electrode 21, the gate line contact pad 22 is positioned in the peripheral region of the array substrate, and the gate line contact pad 22 is connected with the gate line so as to connect the gate line to a driving circuit.

S222: forming a gate insulating layer.

For example, as shown in FIG. 2(c), the gate insulating layer 30 is formed to cover the gate electrode 21, the gate line, the gate line contact pad 22 and a base substrate 10.

S333: forming an active layer, a source electrode, a drain electrode, data line and a data line contact pad.

For example, as shown in FIG. 2(c) to FIG. 2(g), an oxide semiconductor thin film 40 and a source-drain electrode metal thin film 50 are patterned with a dual-tone mask so as to form the active layer 41, the source electrode 51, the drain electrode 52, the data line (not shown) and the data line contact pad 90 by a single patterning process. Difference between step S333 and step S3 is that a pattern of the dual-tone mask is changed so as to enable photoresist fully-reserved portion to correspond to a region where the source electrode and the drain electrode are to be formed, a region where the data line is to be formed, and a region where the data line contact pad is to be formed.

For example, the data line is connected with the source electrode 51, the data line contact pad 90 is positioned in the peripheral region of the array substrate, and the data line contact pad 90 is connected with the data line so as to connect the data lines to the driving circuit.

For example, as shown in FIG. 2(g), the data line contact pad 90 is of a dual-layer structure and includes a semiconductor layer 42 and a metal layer 53, the semiconductor layer 42 and the active layer 41 are made of the same material on the same layer, and the metal layer 53 and the source electrode 51 as well as the drain electrode 52 are made of the same material on the same layer. Similarly, the data line is also of a dual-layer structure, one layer of the data line is made of the same material on the same layer as the active layer 41, and the other layer of the data line is made of the same material on the same layer as the source electrode 51 as well as the drain electrode 52.

In addition, it should be noted that in step S333, a first antioxidant cover layer 61 and a second antioxidant cover layer 62 also can be formed. For example, as shown in FIG. 3(a) to FIG. 3(f), an oxide semiconductor thin film 40, a source-drain electrode metal thin film 50 and an antioxidant thin film are patterned with the dual-tone mask so as to form the active layer 41, the source electrode 51, the drain electrode 52, the data line (not shown), the data line contact pad 90, the first antioxidant cover layer 61 and the second antioxidant cover layer 62 by the single patterning process. In such case, as shown in FIG. 3(f), the data line contact pad 90 is of a three-layer structure and includes the semiconductor layer 42, the metal layer 53 and the antioxidant layer 63, the semiconductor layer 42 and the active layer 41 are made of the same material on the same layer, the metal layer 53 and the source electrode 51 as well as the drain electrode 52 are made of the same material on the same layer, and the antioxidant layer 63 and the first antioxidant cover layer 61 as well as the second antioxidant cover layer 62 are made of the same material on the same layer. Similarly, the data line is also of a three-layer structure, one layer of the data line is made of the same material on the same layer as the active layer 41, another layer of the data line is made of the same material on the same layer as the source electrode 51 as well as the drain electrode 52, and another layer of the data line is made of the same material on the same layer as the first antioxidant cover layer 61 as well as the second antioxidant cover layer 62.

S444: forming a protective layer and via holes.

Figure 4A:
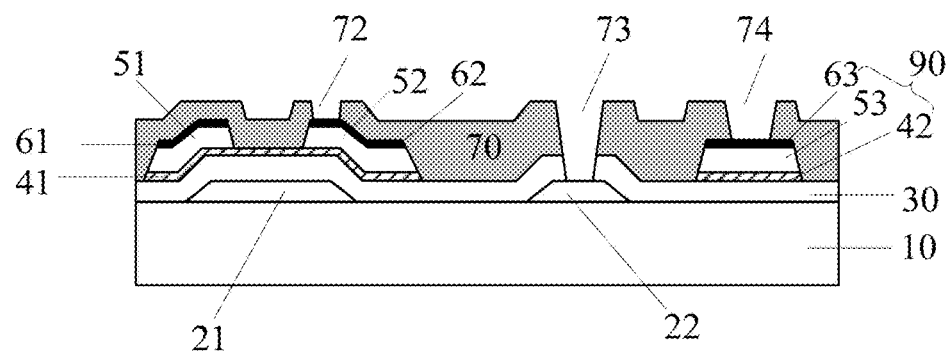
FIG. 4(a) to FIG. 4(b) show a preparation method of an array substrate according to an embodiment of the present disclosure.

For example, as shown in FIG. 4(a), the protective layer 70 is formed, and the protective layer 70 is patterned to form a second via hole 72, a third via hole 73 and a fourth via hole 74. The second via hole 72 exposes the drain electrode 52, the third via hole 73 exposes the gate line contact pad 22, and the fourth via hole 74 exposes the data line contact pad 74.

S555: forming a pixel electrode.

Figure 4B:
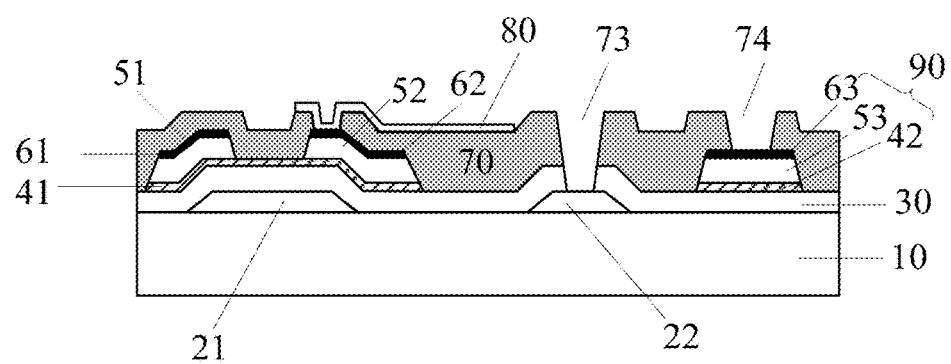

For example, as shown in FIG. 4(b), the pixel electrode 80 is formed, and the pixel electrode 80 is connected with the drain electrode 52 through the second via hole 72. For example, the pixel electrode 80 is made of a transparent conducting material (e.g., ITO).

It should be noted that after step S444 and before step S555, the preparation method of the array substrate according to the embodiment of the present disclosure can further include: carrying out plasma processing/treatment on the second antioxidant cover layer 62 through the second via hole 72. Meanwhile, plasma processing also can be carried out on the antioxidant layer 63 in the data line contact pad 90. The specific details of plasma processing can refer to the description above, and are not repeated herein.

Through steps S111 to S555, the preparation method of the array substrate according to the embodiment of the present disclosure can be completed. The preparation method of the array substrate according to the embodiment of the present disclosure is based on the preparation method of the oxide thin-film transistor according to the embodiment of the present disclosure, and thus, the preparation method of the array substrate according to the embodiment of the present disclosure can obtain the same technical effects as the preparation method of the oxide thin-film transistor according to the embodiment of the present disclosure, which are not repeated herein.

The foregoing embodiments merely are exemplary embodiments of the disclosure, and not intended to define the scope of the disclosure, and the scope of the disclosure is determined by the appended claims.

The present application claims priority of the Chinese Patent Application No. 201510415622.5 filed on Jul. 15, 2015, the disclosure of which are incorporated herein by its reference in its entirety as part of the present application.

What is claimed is:

1. A preparation method of an oxide thin-film transistor, comprising: forming a gate electrode, a gate insulating layer, an active layer, a source electrode and a drain electrode,
    wherein forming of the active layer, the source electrode and the drain electrode includes:
    sequentially forming an oxide semiconductor thin film and a source-drain electrode metal thin film on a base substrate, an entire surface of the oxide semiconductor thin film being in direct contact with the source-drain electrode metal thin film; and
    patterning the oxide semiconductor thin film and the source-drain electrode metal thin film with a dual-tone mask so as to form the active layer, the source electrode and the drain electrode by a single patterning process,
    wherein patterning of the oxide semiconductor thin film and the source-drain electrode metal thin film with a dual-tone mask so as to form the active layer, the source electrode and the drain electrode by the single patterning process includes:
    forming a photoresist layer on the source-drain electrode metal thin film;
    carrying out exposure and development on the photoresist layer to form a photoresist fully-reserved portion, a photoresist partially-reserved portion and a photoresist fully-removed portion, wherein the photoresist fully-reserved portion corresponds to a region where the source electrode and the drain electrode are to be formed, the photoresist partially-reserved portion corresponds to a region, between the source electrode and the drain electrode, where a channel is to be formed, a thickness of photoresist in the photoresist partially-reserved portion is smaller than a thickness of photoresist in the photoresist fully-reserved portion, and the photoresist fully-removed portion corresponds to remaining regions;
    carrying out a first etching process to remove the source-drain electrode metal thin film and the oxide semiconductor thin film in the photoresist fully-removed portion so as to form the active layer;
    carrying out an ashing process to remove the photoresist in the photoresist partially-reserved portion;
    carrying out a second etching process to remove the source-drain electrode metal thin film in the photoresist partially-reserved portion so as to form the source electrode and the drain electrode; and
    removing the photoresist in the photoresist fully-reserved portion,
    wherein the source-drain electrode metal thin film is made of Cu or Cu alloy, and the second etching process adopts a fluoride-free etching solution.

2. The preparation method of the oxide thin-film transistor according to claim 1, wherein the Cu alloy is CuMo alloy, CuMn alloy, CuTa alloy, CuCa alloy, CuMg alloy or CuMgAl alloy.

3. The preparation method of the oxide thin-film transistor according to claim 1, wherein the fluoride-free etching solution is a fluoride-free $H_2O_2$ etching solution.

4. The preparation method of the oxide thin-film transistor according to claim 1, further comprising: forming a first antioxidant cover layer covering the source electrode and a second antioxidant cover layer covering the drain electrode,
wherein forming of the active layer, the source electrode, the drain electrode, the first antioxidant cover layer and the second antioxidant cover layer includes:
sequentially forming the oxide semiconductor thin film, the source-drain electrode metal thin film and an antioxidant thin film on the base substrate; and
patterning the oxide semiconductor thin film, the source-drain electrode metal thin film and the antioxidant thin film with a dual-tone mask so as to form the active layer, the source electrode, the drain electrode, the first antioxidant cover layer and the second antioxidant cover layer by a single patterning process.

5. The preparation method of the oxide thin-film transistor according to claim 4, wherein patterning of the oxide semiconductor thin film, the source-drain electrode metal thin film and the antioxidant thin film with the dual-tone mask so as to form the active layer, the source electrode, the drain electrode, the first antioxidant cover layer and the second antioxidant cover layer by the single patterning process includes:
forming a photoresist layer on the antioxidant thin film, and
carrying out exposure and development on the photoresist layer to form a photoresist fully-reserved portion, a photoresist partially-reserved portion and a photoresist fully-removed portion, wherein the photoresist fully-reserved portion corresponds to a region where the source electrode and the drain electrode are to be formed, the photoresist partially-reserved portion corresponds to a region, between the source electrode and the drain electrode, where a channel is to be formed, a thickness of photoresist in the photoresist partially-reserved portion is less than a thickness of photoresist in the photoresist fully-reserved portion, and the photoresist fully-removed portion corresponds to remaining regions;
carrying out a first etching process to remove the antioxidant thin film, the source-drain electrode metal thin film and the oxide semiconductor thin film in the photoresist fully-removed portion so as to form the active layer;
carrying out an ashing process to remove the photoresist in the photoresist partially-reserved portion;
carrying out a second etching process to remove the antioxidant thin film in the photoresist partially-reserved portion so as to form the first antioxidant cover layer and the second antioxidant cover layer;
carrying out a third etching process to remove the source-drain electrode metal thin film in the photoresist partially-reserved portion so as to form the source electrode and the drain electrode; and
removing the photoresist in the photoresist fully-reserved portion.

6. The preparation method of the oxide thin-film transistor according to claim 5, wherein the source-drain electrode metal thin film is made of Cu or Cu alloy, and the third etching process adopts a fluoride-free etching solution.

7. The preparation method of the oxide thin-film transistor according to claim 6, wherein the Cu alloy is CuMo alloy, CuMn alloy, CuTa alloy, CuCa alloy, CuMg alloy or CuMgAl alloy.

8. The preparation method of the oxide thin-film transistor according to claim 6, wherein the fluoride-free etching solution is a fluoride-free $H_2O_2$ etching solution.

9. The preparation method of the oxide thin-film transistor according to claim 5, wherein the first etching process and the second etching process are wet etching processes, and an etching rate of the second etching process is smaller than that of the first etching process.

10. The preparation method of the oxide thin-film transistor according to claim 4, wherein the first antioxidant cover layer and the second antioxidant cover layer are made of Mo or MoNb.

11. The preparation method of the oxide thin-film transistor according to claim 4, wherein the first antioxidant cover layer and the second antioxidant cover layer are made of an oxide semiconductor material.

12. The preparation method of the oxide thin-film transistor according to claim 11, further comprising: carrying out plasma processing on the first antioxidant cover layer and/or the second antioxidant cover layer.

13. The preparation method of the oxide thin-film transistor according to claim 12, further comprising:
forming a protective layer to cover the first antioxidant cover layer, the second antioxidant cover layer, the source electrode, the drain electrode, the active layer, the gate insulating layer and the base substrate; and
forming a first via hole in the protective layer so as to carry out plasma processing on the first antioxidant cover layer through the first via hole, and/or forming a second via hole in the protective layer so as to carry out plasma processing on the second antioxidant cover layer through the second via hole.

14. The preparation method of the oxide thin-film transistor according to claim 13, wherein operations of forming the first via hole in the protective layer, forming the second via hole in the protective layer and carrying out plasma processing on the first antioxidant cover layer and/or the second antioxidant cover layer are carried out in a same dry-etching device.

15. The preparation method of the oxide thin-film transistor according to claim 12, wherein a gas for carrying out the plasma processing is selected from one or more of He, $SF_6$ or $H_2$.

16. The preparation method of the oxide thin-film transistor according to claim 11, wherein the first antioxidant cover layer, the second antioxidant cover layer and the active layer are made of a same material.

17. The preparation method of the oxide thin-film transistor according claim 4, wherein a pattern of the first antioxidant cover layer is same as a pattern of the source electrode, and a pattern of the second antioxidant cover layer is same as a pattern of the drain electrode.

18. A preparation method of an oxide thin-film transistor, comprising: forming a gate electrode, a gate insulating layer, an active layer, a source electrode and a drain electrode,
wherein forming of the active layer, the source electrode and the drain electrode includes:
sequentially forming an oxide semiconductor thin film and a source-drain electrode metal thin film on a base substrate, an entire surface of the oxide semiconductor thin film being in direct contact with the source-drain electrode metal thin film; and
patterning the oxide semiconductor thin film and the source-drain electrode metal thin film with a dual-tone mask so as to form the active layer, the source electrode and the drain electrode by a single patterning process,
wherein the method further comprises: forming a first antioxidant cover layer covering the source electrode and a second antioxidant cover layer covering the drain electrode, wherein the first antioxidant cover layer and the second antioxidant cover layer are made of an oxide semiconductor material, and wherein the method further comprises:

forming a protective layer to cover the first antioxidant cover layer, the second antioxidant cover layer, the source electrode, the drain electrode, the active layer, the gate insulating layer and the base substrate; and forming a first via hole in the protective layer so as to carry out plasma processing on the first antioxidant cover layer through the first via hole, and/or forming a second via hole in the protective layer so as to carry out plasma processing on the second antioxidant cover layer through the second via hole.

\* \* \* \* \*